United States Patent
Kuge et al.

(10) Patent No.: US 8,766,446 B2
(45) Date of Patent: Jul. 1, 2014

(54) SEMICONDUCTOR MEMORY DEVICE

(75) Inventors: Nobuhito Kuge, Tokyo (JP); Naoki Yasuda, Kanagawa-ken (JP); Yoshiaki Fukuzumi, Kanagawa-ken (JP); Tomoko Fujiwara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/599,053

(22) Filed: Aug. 30, 2012

(65) Prior Publication Data

US 2013/0228928 A1 Sep. 5, 2013

(30) Foreign Application Priority Data

Mar. 2, 2012 (JP) ................. 2012-046811

(51) Int. Cl.
*H01L 23/495* (2006.01)
*H01L 21/3205* (2006.01)

(52) U.S. Cl.
USPC ............ 257/760; 257/E23.016; 257/E21.294; 257/324; 257/306; 257/390; 257/316

(58) Field of Classification Search
USPC ............ 257/324, E29.309, 316, 306, 390, 257/E27.103, 760, E23.016, E21.294; 438/624
See application file for complete search history.

(56) References Cited

U.S. PATENT DOCUMENTS

| | | | |
|---|---|---|---|
| 2009/0146206 A1 | 6/2009 | Fukuzumi et al. | |
| 2009/0294828 A1 | 12/2009 | Ozawa et al. | |
| 2009/0321813 A1 | 12/2009 | Kidoh et al. | |
| 2010/0019310 A1* | 1/2010 | Sakamoto | 257/324 |
| 2010/0109071 A1* | 5/2010 | Tanaka et al. | 257/324 |
| 2010/0151635 A1* | 6/2010 | Chung | 438/156 |
| 2010/0207195 A1 | 8/2010 | Fukuzumi et al. | |
| 2011/0199825 A1 | 8/2011 | Han et al. | |
| 2012/0232377 A1 | 9/2012 | Nottmeier | |

FOREIGN PATENT DOCUMENTS

| | | |
|---|---|---|
| JP | 2007-311291 A | 11/2007 |
| JP | 2007-320215 A | 12/2007 |
| JP | 2008-171838 A | 7/2008 |
| JP | 2009-135324 A | 6/2009 |
| JP | 2009-146954 A | 7/2009 |
| JP | 2009-295617 A | 12/2009 |
| JP | 2010-10596 A | 1/2010 |
| JP | 2011-170953 A | 9/2011 |

* cited by examiner

*Primary Examiner* — Alexander Oscar Williams
(74) *Attorney, Agent, or Firm* — Oblon, Spivak, McClelland, Maier & Neustadt, L.L.P.

(57) ABSTRACT

A semiconductor memory device comprising a stacked unit, a semiconductor pillar, a charge storage layer, and a non-insulating film. The stacked unit includes first conductive layers and first insulating layers which are stacked alternately. The semiconductor pillar passes through the stacked body and the semiconductor pillar has a tubular structure. The charge storage layer is provided between the semiconductor pillar and each of the first conductive layers. The non-insulating film is provided inside the tubular structure and has a non-insulating member. The first effective impurity concentration of the non-insulating film is lower than a second effective impurity concentration of the semiconductor pillar.

10 Claims, 10 Drawing Sheets

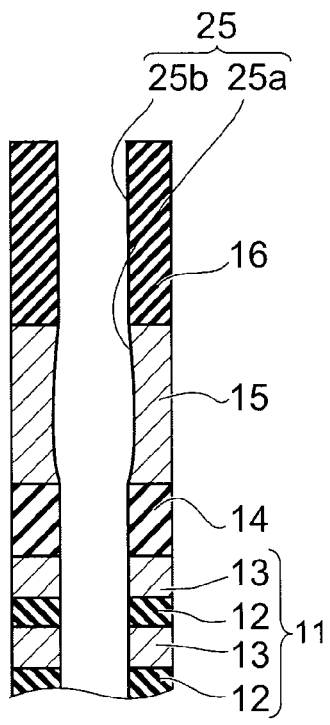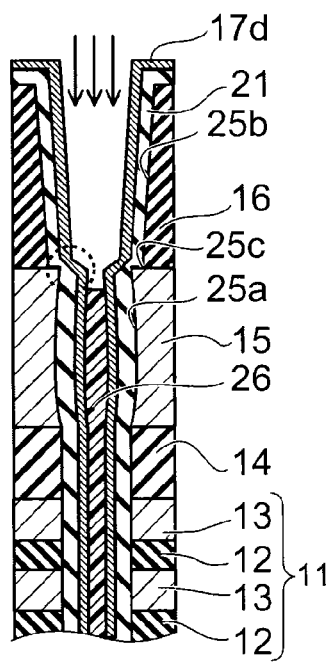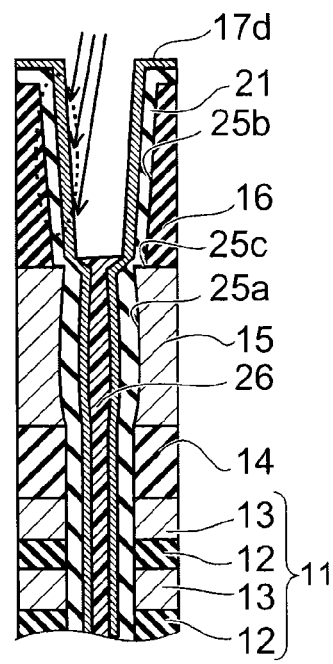
FIG. 8A  FIG. 8B  FIG. 8C
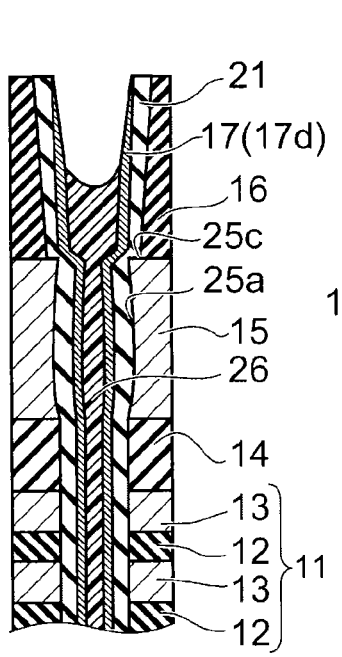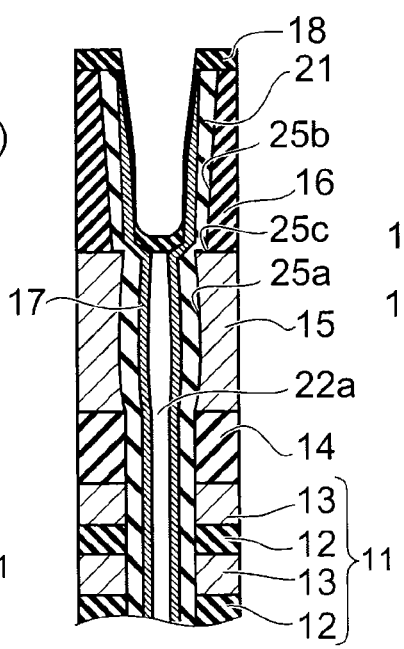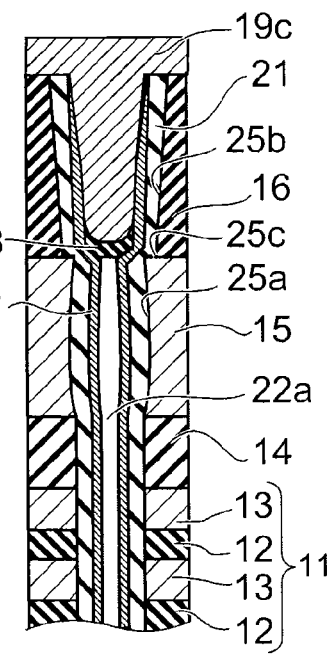
FIG. 8D  FIG. 8E  FIG. 8F

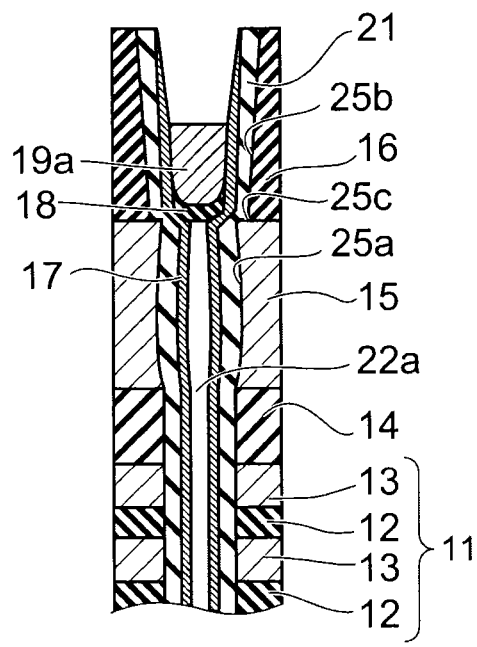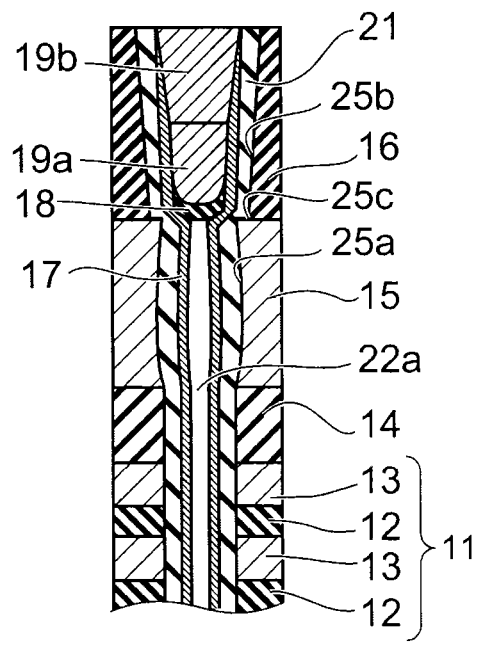
FIG. 9A  FIG. 9B
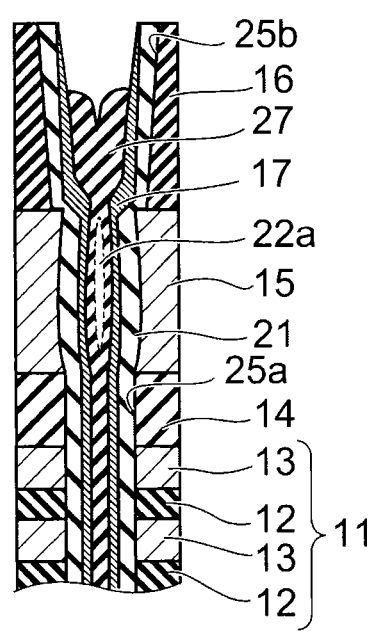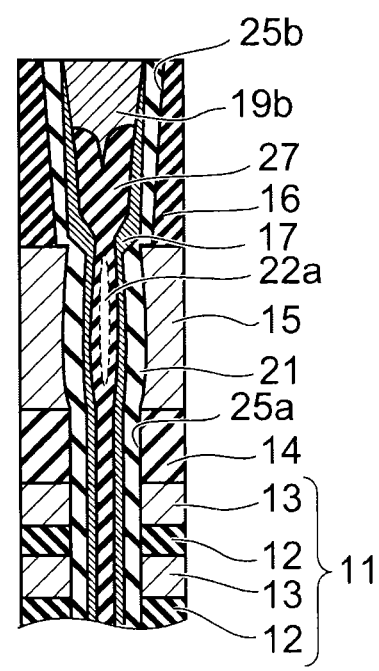
FIG. 10A  FIG. 10B

SEMICONDUCTOR MEMORY DEVICE

CROSS-REFERENCE TO RELATED APPLICATIONS

This application is based upon and claims the benefit of priority from the prior Japanese Patent Application No. 2012-046811, filed on Mar. 2, 2012; the entire contents of which are incorporated herein by reference.

FIELD

Embodiments described herein relate generally to a semiconductor device and a method for manufacturing the same.

BACKGROUND

Conventionally, a cost reduction has been advanced by reducing a cell dimension in a semiconductor memory device. However, in conjunction with a reduction of a processed dimension, there is going to come to a condition that a cost by a lithography rises, and the reduction of dimension is not directly connected with the cost reduction. Even by using a double patterning which can reduce a width of drawing while using the conventional lithography device, a cost increase due to an increase of the process number comes to a bottle neck.

As a means for solving this condition, a so-called bit cost scalable memory (BiCS) has been proposed. In this method, a memory hole coming to a memory is formed in a stacked gate configuration, and an insulating film including a charge storage layer, and a semiconductor film coming to a channel are formed in an inner portion. It is possible to increase a bit number per unit area and reduce a manufacturing cost by increasing the number of stack.

In the BiCS in which a degree of integration is improved, how a charge retaining property is improved is going to be important.

BRIEF DESCRIPTION OF THE DRAWINGS

FIGS. 8A to 8F are process cross sectional views illustrating a method for manufacturing a semiconductor device according to a fourth embodiment;

FIGS. 9A and 9B are process cross sectional views illustrating the method for manufacturing the semiconductor device according to the fourth embodiment;

FIGS. 10A and 10B are process cross sectional views illustrating a method for manufacturing a semiconductor device according to a comparative example of the fourth embodiment;

DETAILED DESCRIPTION

In general, according to one embodiment, a semiconductor device includes a stacked body, a second conductive layer, a second insulating layer, a tubular semiconductor pillar, an insulating film and an occlusion film. The stacked body includes a first conductive layer and a first insulating layer provided on the first conductive layer. The second conductive layer is provided on the stacked body. The second insulating layer is provided on the second conductive layer. The tubular semiconductor pillar is provided in such a manner as to pass through the second insulating layer, the second conductive layer and the stacked body. The insulating film is provided between the semiconductor pillar, and the second insulating layer, the second conductive layer and the stacked body. The occlusion film occludes the tube in a lower portion of the portion passing through the second insulating layer in the semiconductor pillar. The tube below the occlusion film in the semiconductor pillar is an air gap.

According to another embodiment, a method is disclosed for manufacturing a semiconductor device. The method can form a second conductive layer on a stacked body which includes a first conductive layer, and a first insulating layer provided on the first conductive layer. The method can form a second insulating layer on the second conductive layer. The method can form a hole in such a manner as to pass through the second insulating layer, the second conductive layer and the stacked body. The method can form an insulating film in such a manner as to cover a side surface of the hole, and forming a semiconductor film in such a manner as to cover the side surface of the hole via the insulating film. The method can form an occlusion film which occludes a lower portion of a portion passing through the second insulating layer in the hole covered by the semiconductor film, and setting a portion below the occlusion film in the hole to an air gap.

Various embodiments will be described hereinafter with reference to the accompanying drawings.

First Embodiment

First of all, a description will be given of a first embodiment.

Figure 1:
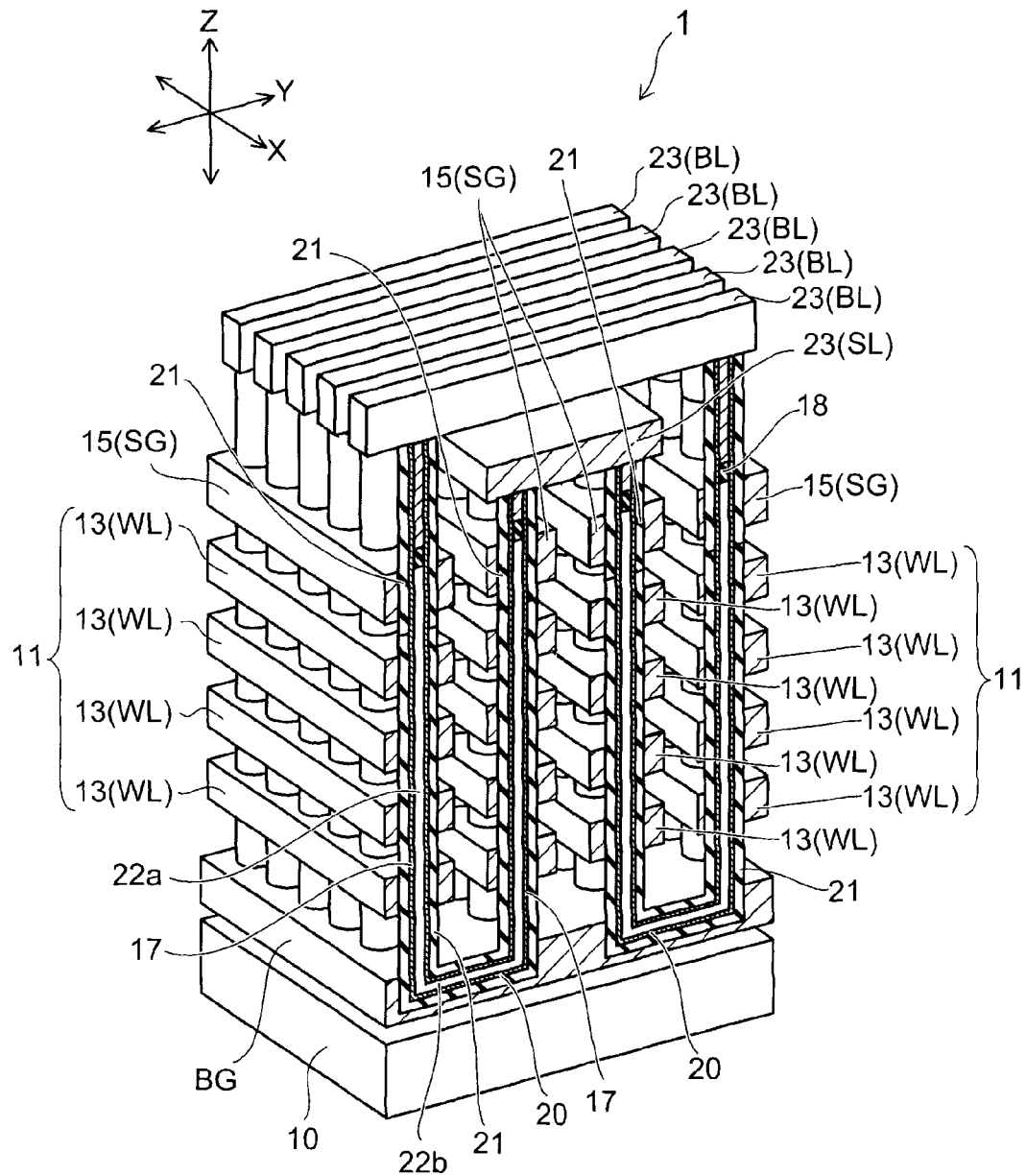
FIG. 1 is a perspective view illustrating a semiconductor device according to a first embodiment.

FIG. 1 is a perspective view illustrating a semiconductor device according to the first embodiment.

Figure 2A:
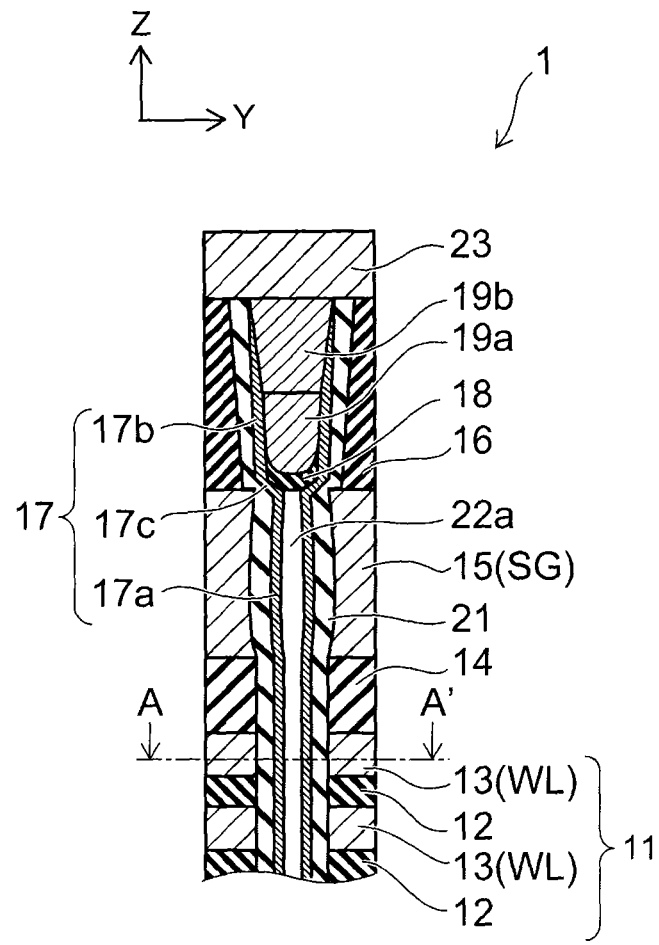
FIG. 2A is a cross sectional view illustrating the semiconductor device according to the first embodiment.
Figure 2B:
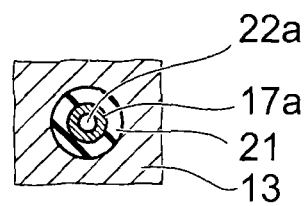
FIG. 2B is a cross sectional view along a line AA' shown in FIG. 2A illustrating the semiconductor device according to the first embodiment.

FIG. 2A is a cross sectional view illustrating the semiconductor device according to the first embodiment and FIG. 2B is a cross sectional view along a line AA' shown in FIG. 2A illustrating the semiconductor device according to the first embodiment.

Figure 3A:
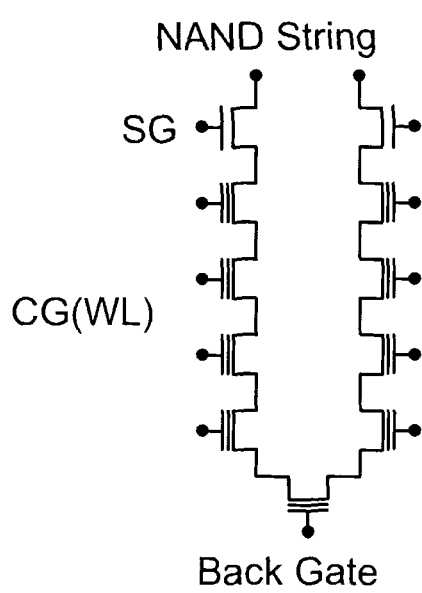
FIG. 3A is a circuit diagraph illustrating a NAND string in the semiconductor device according to the first embodiment.
Figure 3B:
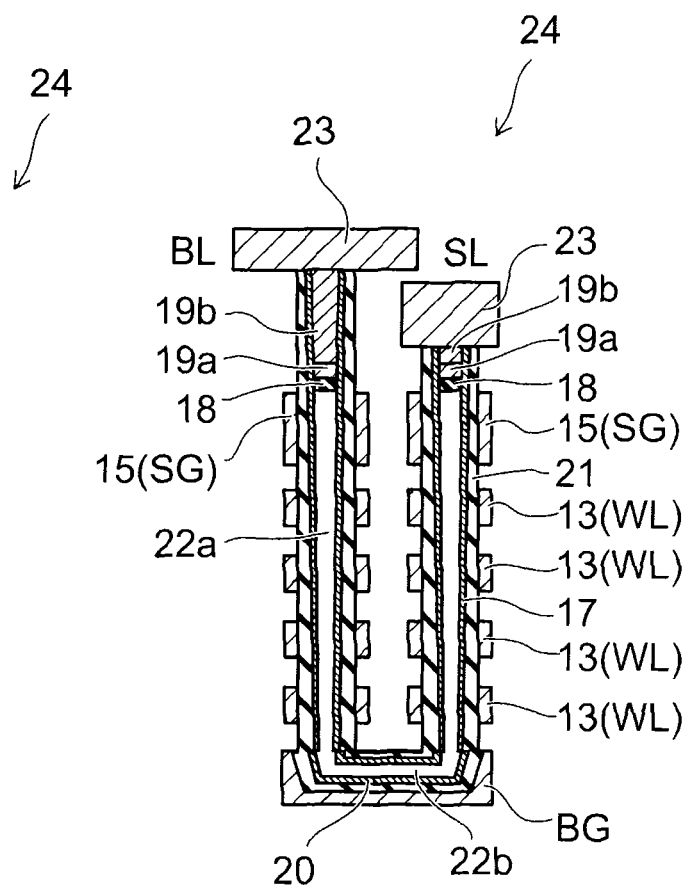
FIG. 3B is a cross sectional view illustrating the NAND string in the semiconductor device according to the first embodiment.

FIG. 3A is a circuit diagraph illustrating a NAND string in the semiconductor device according to the first embodiment and FIG. 3B is a cross sectional view illustrating the NAND string in the semiconductor device according to the first embodiment.

As shown in FIG. 1, a semiconductor device 1, for example, a semiconductor memory device is provided with a substrate 10. On the substrate 10, there are provided a plurality of back gates BG which extend in one direction within a surface parallel to an upper surface of the substrate 10, via an insulating layer which is not shown. The back gate BG is, for example, a silicon (Si) layer on which impurities are doped.

Hereinafter, in the specification, in order to describe the semiconductor device 1, an XYZ rectangular coordinate system is employed. In this XYZ rectangular coordinate system, one direction is set to a direction X in a plane which is in parallel to an upper surface of the substrate 10. A direction which is orthogonal to the direction X is set to a direction Y in the plane which is in parallel to the upper surface of the substrate 10. A direction which is orthogonal to both the direction X and the direction Y is set to a direction Z. An upward direction is the direction Z.

As shown in FIG. 1, FIG. 2A and FIG. 2B, a plurality of stacked bodies 11 extending in the direction X are provided on the back gate BG. The stacked body 11 is configured such that a plurality of insulating layers 12 and a plurality of conductive layers 13 are alternately stacked with each other by setting an upward direction to a stacking direction. In FIG. 1, in order to easily view the drawing, an illustration of the other insulating portions than the insulating film 21 is omitted. The stacked body 11 includes at least one insulating layer 12 and at least one conductive layer 13. The conductive layer 13 includes, for example, a polycrystalline silicon (polysilicon) to which a boron (B) is doped. The conductive layer 13 is used, for example, in a word line WL of the semiconductor device 1.

A conductive layer 15 is provided on the stacked body 11 via an insulating layer 14. The conductive layer 15 includes, for example, a polycrystalline silicon to which the boron (B) is doped. The conductive layer 15 is used, for example, in a selector gate SG of the semiconductor device 1. An insulating layer 16 is provided on the conductive layer 15.

A tubular semiconductor pillar 17 is provided in such a manner as to pass through the insulating layer 16, the conductive layer 15, the insulating layer 14 and the stacked body 11 and reach the back gate BG. A thickness between an inner wall and an outer wall which form a tube of the semiconductor pillar 17 is, for example, 7 nm. An inner diameter of the tube is 20 nm.

The semiconductor pillar 17 includes a polysilicon to which an impurity is doped. An outer diameter of a portion 17b which passes through the insulating layer 16 in the semiconductor pillar 17 is larger than an outer diameter of a portion 17a which passes through the conductive layer 15, the insulating layer 14 and the stacked body 11 in the semiconductor pillar 17. A difference in the outer diameter is not less than 10 nm, for example, 10 nm. A step 17c is formed in a side surface of the portion 17b and a side surface of the portion 17a. A width of the step 17c is not less than 5 nm, for example, 5 nm. For example, an impurity concentration of the portion 17b including the portion of the step 17c may be higher than an impurity concentration of the portion 17a. The portion 17b serves, for example, as a diffusion layer.

An occlusion film 18, for example, a silicon oxide film is embedded in the tube in a lower portion of the portion 17b. In other words, the occlusion film 18 occludes the tube in the lower portion of the portion 17b. Within the tube above the occlusion film 18 in the portion 17b, a semiconductor film 19a is embedded in a lower portion, and a conductive film 19b is embedded in an upper portion. The semiconductor film 19a includes, for example, a non-doped polysilicon. The conductive film 19b includes, for example, a polysilicon to which a phosphor (P) is doped.

A connection portion 20 which is formed as a U-shaped form as seen from a direction X is provided in an inner portion of the back gate BG. The connection portion 20 is formed as a tubular shape, and includes a polysilicon to which an impurity is doped. In an upper surface of the back gate BG, each of both ends of the connection portion 20 is connected to the semiconductor pillar 17.

An insulating film 21 is provided between the semiconductor pillar 17 and the connection portion 20, and the insulating layer 16, the conductive layer 15, the insulating layer 14, the stacked body 11 and the back gate BG. The insulating film 21 is constructed, for example, by an ONO film, and has a stacked configuration of a silicon oxide film, a silicon nitride film and a silicon oxide film.

An inner side of the tube below the occlusion film 18 in the semiconductor pillar 17 comes to an air gap 22a. An inner side of the tube of the connection portion 20 comes to an air gap 22b. The air gap 22a and the air gap 22b are integrated so as to come to an air gap 22.

A wiring 23 is provided on the insulating layer 16. The wiring 23 comes into contact with the conductive film 19b. The wiring 23 is used, for example, in a bit line BL or a source line SL of the semiconductor device 1.

Next, a description will be given of an action of the semiconductor device 1 according to the embodiment.

As shown in FIGS. 3A and 3B, a NAND strings 24 is constructed by the connection portion 20 and two semiconductor pillars 17 which are connected by the connection portion 20. One end of the NAND strings 24 is connected to the bit line BL, and another end is connected to the source line SL. The conductive layer 15 is used as the selector gate SG, and the conductive layer 13 is used as the word line WL. The semiconductor pillar 17 is used as a channel. The insulating film 21 includes a charge storage layer. A writing and a deleting can be achieved in accordance with an FN tunneling by applying a high electric field to the insulating film 21. An intersecting point of the word line WL and the semiconductor pillar 17 is used as a memory cell. A storage and a discharge of the electric field to the charge storage layer are controlled by circulating an electric current to the semiconductor pillar 17 by the selector gate SG and applying an electric voltage to the selected word line WL. Accordingly, the writing and the deleting with respect to the memory cell are carried out.

Next, a description will be given of an effect of the embodiment.

In the semiconductor device 1 according to the embodiment, the occlusion film 18 is arranged in a lower portion of the portion 17b of the semiconductor pillar 17. Accordingly, it is possible to set an inner side of the tube of the portion 17a to an air gap. Accordingly, an insulating film which traps an electric charge is not formed within the tube of the portion 17a. Accordingly, it is possible to improve a charge retaining property of the semiconductor device 1, and it is possible to suppress a fluctuation of a threshold value. Therefore, it is possible to improve an electric property of the semiconductor device 1.

Further, since the occlusion film 18 is arranged in the lower portion of the portion 17b of the semiconductor pillar 17, the occlusion film 18 can be used as a mask at a time of injecting the impurity to the semiconductor pillar 17.

Further, it is possible to make a contact between the portion 17b and the wiring 23, and the conductive film 19b easy by making an outer diameter of the portion 17b of the semiconductor pillar 17 larger than an outer diameter of the portion 17a.

In this case, the occlusion film 18 is not limited to the silicon oxide film. It may be constructed by an insulating film, a semiconductor film and a metal film as long as it can occlude the inner side of the tube of the semiconductor pillar 17. For example, it may be constructed by a silicon film, a silicon nitride film, a film of a high dielectric constant material, or a film of a low dielectric constant material.

Comparative Example

Next, a description will be given of a comparative example of the first embodiment.

Figure 4A:
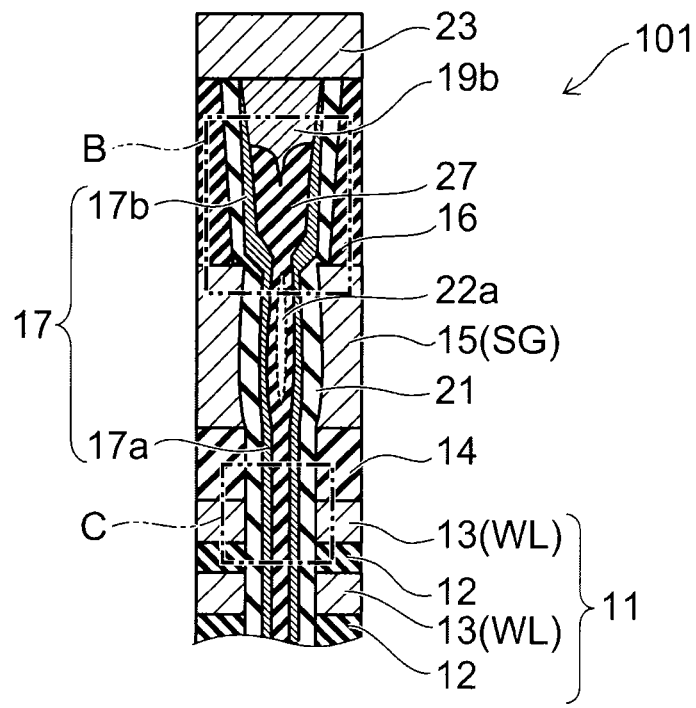
FIG. 4A is a cross sectional view illustrating a semiconductor device according to a comparative example of the first embodiment.
Figure 4B:
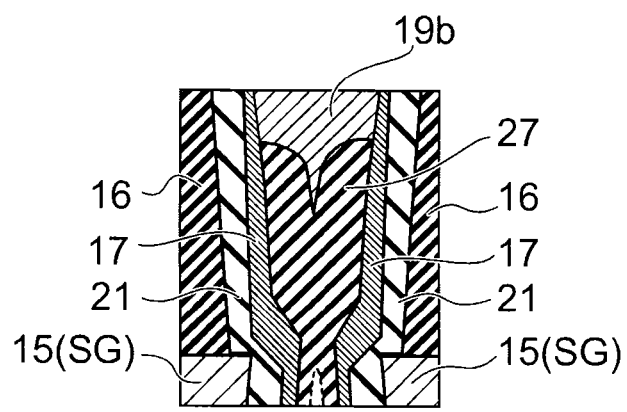
FIGS. 4B and 4C are enlarged view of an area B and an area C shown in FIG. 4A illustrating the semiconductor device according to the comparative example of the first embodiment.
Figure 4C:
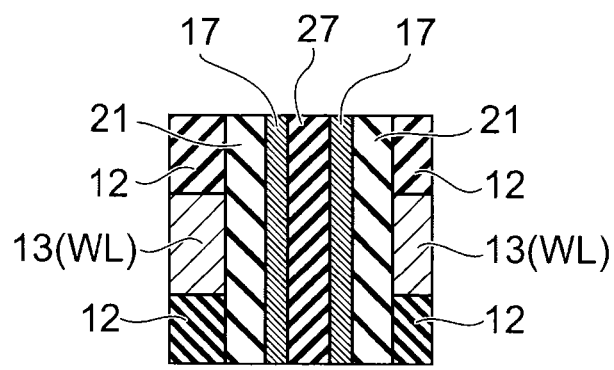

FIG. 4A is a cross sectional view illustrating a semiconductor device according to the comparative example of the first embodiment, and FIGS. 4B and 4C are enlarged view of an area B and an area C shown in FIG. 4A illustrating the semiconductor device according to the comparative example of the first embodiment.

As shown in FIGS. 4A to 4C, in a semiconductor device 101, an insulating film 27, for example, a silicon nitride film is embedded within the tube of the lower portion of the portion 17b and the tube of the portion 17a in the semiconductor pillar 17. The insulating film 27 is also embedded within the tube of the connection portion 20.

In the comparative example, in the case of comparing with the first embodiment mentioned above, a property is relatively inferior.

Second Embodiment

Next, a description will be given of a second embodiment.

Figure 5:
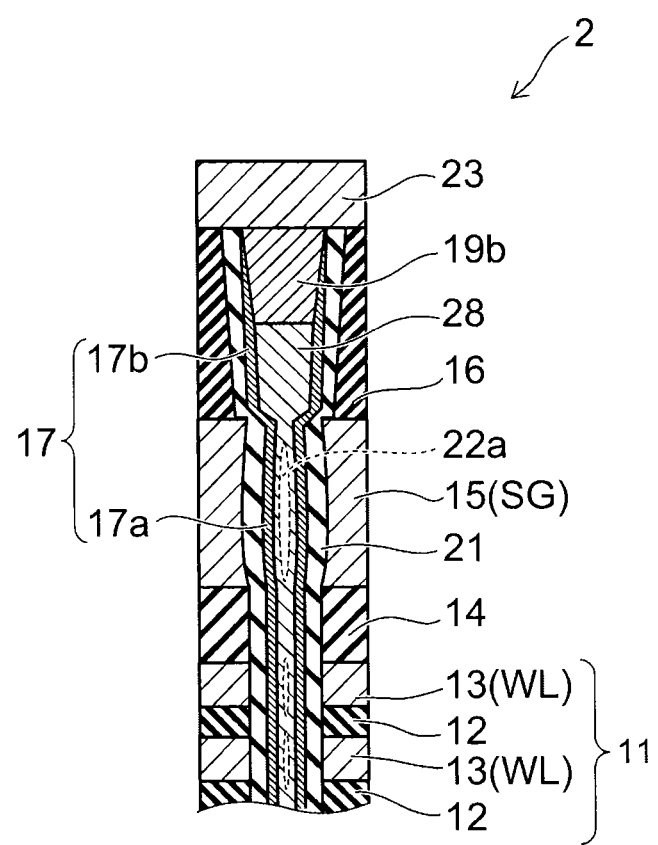
FIG. 5 is a cross sectional view illustrating a semiconductor device according to a second embodiment.

FIG. 5 is a cross sectional view illustrating a semiconductor device according to a second embodiment.

As shown in FIG. 5, in a semiconductor device 2 according to the embodiment, a non-insulating member 28, for example, non-doped polysilicon is embedded within the tube in the lower portion of the portion 17b and the tube of the portion 17a in the semiconductor pillar 17. Non-insulating member 28 is embedded also within the tube of the connection portion 20. The non-insulating member 28 is configured such that an effective impurity concentration is not less than $10^{14}$ atomic $cm^{-3}$.

In this case, in the specification, "effective impurity concentration" means a concentration of an impurity which contributes to a conducting of the semiconductor material, for example, in the case that both the impurity coming to a donor and the impurity coming to an acceptor are included in the semiconductor material, it means a concentration of the impurity obtained by removing a cancelled part of the donor and the acceptor in the activated impurity.

For example, the effective impurity concentration of the non-insulating member 28 is made lower than the effective impurity concentration of the semiconductor pillar 17. A conductive film 19b is embedded within the tube above the non-insulating member 28 in the semiconductor pillar 17.

In the embodiment, even if an electron which is discharged from the charge storage layer jumps over the semiconductor pillar 17 so as to move to the non-insulating member 28, the electron moves in the non-insulating member 28 and is discharged to an outer portion of the non-insulating member 28. Accordingly, it is possible to suppress a fluctuation of a threshold value in the semiconductor pillar 17. Accordingly, it is possible to improve an electric property of the semiconductor device 101.

The other configurations, actions and effects than the above in the embodiment are the same as the first embodiment mentioned above.

In this case, the non-insulating member 28 may be configured such as to include at least one material which is selected from a group consisting of silicon, Ge and SiGe in which an effective impurity concentration is not less than 1014 atomic $cm^{-3}$, in addition to the non-doped polysilicon.

Variation of Second Embodiment

Next, a description will be given of a variation of the second embodiment.

Figure 6A:
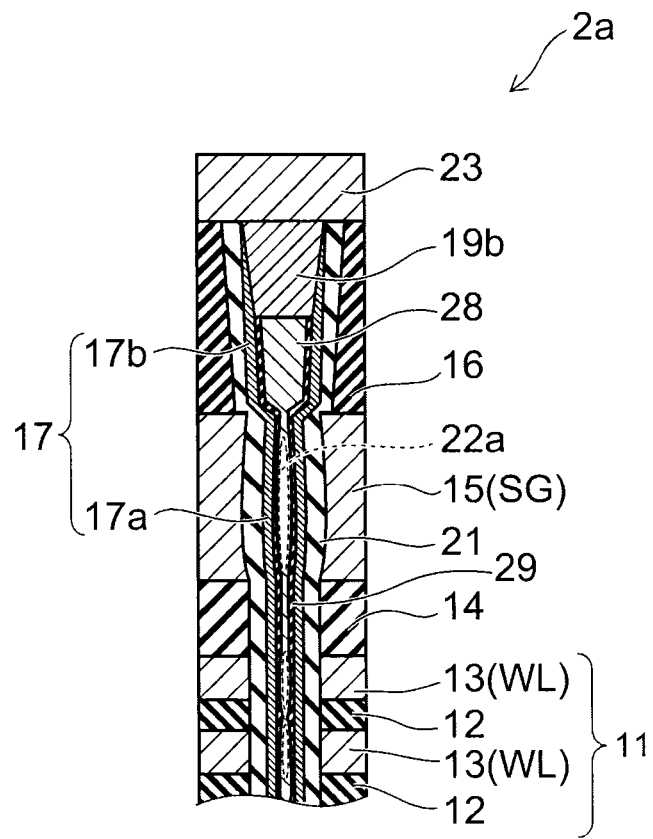
FIG. 6A is a cross sectional view illustrating a semiconductor device according to a variation of the second embodiment.
Figure 6B:
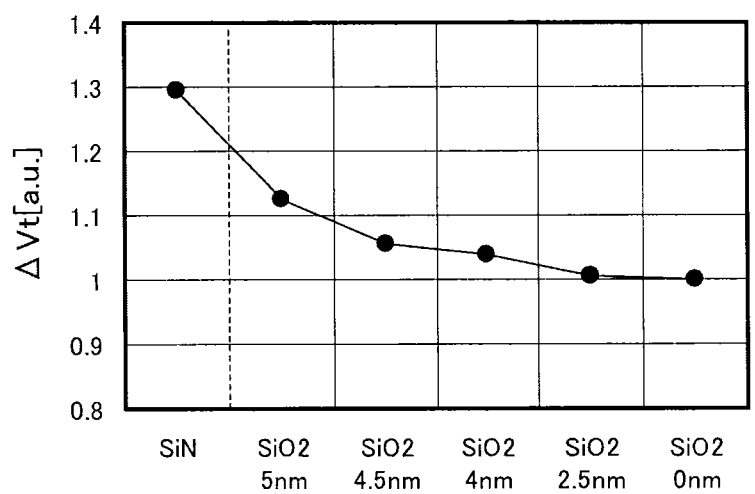
FIG. 6B is a graph illustrating a relationship between a thickness of an insulating film and a shift amount of a threshold value, in the semiconductor device according to the variation of the second embodiment.

FIG. 6A is a cross sectional view illustrating a semiconductor device according to a variation of the second embodiment, and FIG. 6B is a graph illustrating a relationship between a thickness of an insulating film and a shift amount of a threshold value, in the semiconductor device according to the variation of the second embodiment, in which a horizontal axis indicates the thickness of the insulating film, and a vertical axis indicates the shift amount of the threshold value.

As shown in FIG. 6A, in a semiconductor device 2a according to the variation, an insulating film 29, for example, a silicon oxide film is formed between the semiconductor pillar 17 and the non-insulating member 28.

As shown in FIG. 6B, in the case that the insulating film 29 is the silicon oxide film, the thinner the film thickness is, the more the shift amount of the threshold value is reduced. The shift amount is a shift amount of the threshold value between just after writing after 3600 W/E cyclings, and after a fixed time has passed. If the film thickness is made not more than 2.5 nm, it comes to the shift amount of the same threshold value as the second embodiment in which the film thickness is 0, that is, the silicon oxide film is not formed. This means that if the film thickness is made not more than 2.5 nm, the electron is detrapped, that is, the electron is easily returned to the semiconductor pillar 17 in accordance with a direct tunneling phenomenon, even if the electron is trapped by the silicon oxide film.

Since the direct tunnel phenomenon is remarkably seen if the film thickness of the silicon oxide film becomes not more than 3 nm, it can be thought that the trap of the electron to the silicon oxide film is negligible if the film thickness of the silicon oxide film can be held down to 3 nm or less.

SiN in FIG. 6B shows the case of the semiconductor device 101 according to the comparative example mentioned above. In the material which is embedded into the tube of the semiconductor pillar 17, the shift amount of the threshold value is larger in the silicon nitride film than in the silicon oxide film. This means that the trap amount of the electron is larger in the silicon nitride film than in the silicon oxide film.

According to the variation, since the insulating film 29 is formed, it is possible to suppress a diffusion of the impurity between the semiconductor pillar 17 and the non-insulating member 28. The other configurations and effects than the above in the variation are the same as the first embodiment mentioned above.

Third Embodiment

Next, a description will be given of a third embodiment.

Figure 7:
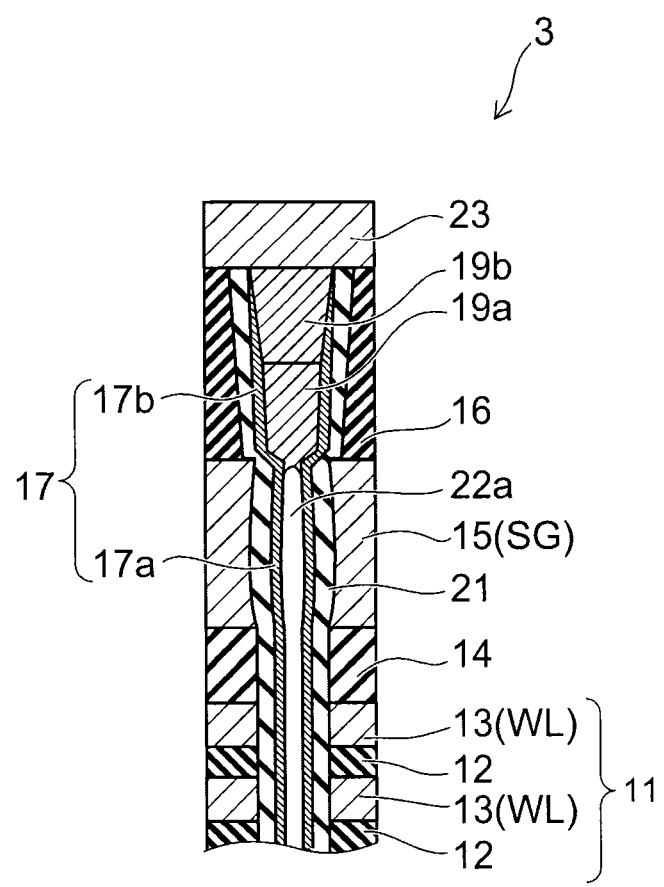
FIG. 7 is a cross sectional view illustrating a semiconductor device according to a third embodiment.

FIG. 7 is a cross sectional view illustrating a semiconductor device according to a third embodiment.

As shown in FIG. 7, in a semiconductor device 3 according to the embodiment, a semiconductor film 19a, for example, a silicon film is embedded within a tube in a lower portion of the portion 17b in the semiconductor pillar 17. An air gap 22a is formed within the tube of the portion 17a of the semiconductor pillar 17. A conductive film 19b is embedded within a tube above the semiconductor film 19a in the portion 17b of the semiconductor pillar 17.

According to the embodiment, the semiconductor film 19a serves as a diffusion layer which is formed above the selector gate SG, together with the portion 17b. Accordingly, since a cross sectional area of the diffusion layer becomes larger, it is possible to reduce a resistance of the diffusion layer and a contact resistance. Further, the semiconductor film 19a is not formed in an inner portion of the selector gate SG. Accordingly, a profile of the diffusion layer is not affected by a heat process, and it is possible to retain a steep diffusion layer profile. Accordingly, since an electric property of the semiconductor device 3 is not deteriorated, it is easy to carry out a deletion to the cell.

The other configurations, actions and effects than the above in the embodiment are the same as the first embodiment mentioned above.

Fourth Embodiment

Next, a description will be given of a fourth embodiment.

FIGS. 8A to 8F and FIGS. 9A and 9B are process cross sectional views illustrating a method for manufacturing a semiconductor device according to the fourth embodiment. The embodiment relates to the manufacturing method of the semiconductor device 1 according to the first embodiment.

As shown in FIG. 8A, the stacked body 11 is formed. The stacked body 11 is configured such that the insulating layers 12 and the conductive layers 13 are alternately stacked. The stacking direction is set to an upward direction. The conductive layer 13 is formed by using the polycrystalline silicon to which the boron is doped. The insulating layer 14 is formed on the stacked body 11. Thereafter, the conductive layer 15 is formed on the insulating layer 14. The conductive layer 15 is also formed by using the polycrystalline silicon to which the boron is doped. The insulating layer 16 is formed on the conductive layer 15. Next, the memory hole 25 is formed from the upper surface of the insulating layer 16 in such a manner as to pass through the insulating layer 16, the conductive layer 15, the insulating layer 14 and the stacked body 11. The portion formed on the conductive layer 15, the insulating layer 14 and the stacked body 11 in the memory hole 25 is called as a memory hole 25a, and the portion formed on the insulating layer 16 in the memory hole 25 is called as a memory hole 25b.

Next, as shown in FIG. 8B, a natural oxide film on a side surface of the memory hole 25 is removed, for example, by a hydrofluoric acid. At this time, a side surface of the memory hole 25b is also removed, and an inner diameter of the memory hole 25b becomes larger. Accordingly, a step 25c is formed between the side surface of the memory hole 25b and the side surface of the memory hole 25a. An upper surface of the conductive layer 15 is exposed to the step 25c. For example, the upper surface of the conductive layer 15 is exposed at a width which is not less than 5 nm, favorably at a width of 5 nm, from an end edge of an opening of the memory hole 25a.

Next, the insulating film 21 is formed on the insulating layer 16 in such a manner as to cover the side surface of the memory hole 25. The insulating film 21 is configured, for example, as the stacked configuration of the ONO film, that is, the silicon oxide film, the silicon nitride film and the silicon oxide film. The ONO film forms the silicon oxide film, the silicon nitride film and the silicon oxide film on the side surface of the memory hole in this order. The insulating film 21 is formed along the side surfaces of the insulating layer 16 and the conductive layer 15 and the shape of the step 25c. Accordingly, the insulating film 21 is also formed on the exposed conductive film 15. Next, the semiconductor film 17d, for example, the polysilicon film is formed in such a manner as to cover the side surface of the memory hole 25 via the insulating film 21. The semiconductor film 17d is also formed along the side surfaces of the insulating layer 16 and the conductive layer 15 and the shape of the step 25c. Accordingly, the conductive film 17d is also formed on the exposed conductive layer 15.

Next, a photo resist 26 is applied onto the insulating layer 16 in such a manner as to embed an inner portion of the memory hole 25. Thereafter, an etching back is carried out with respect to the photo resist 26, and an upper surface of the photo resist 26 is set to a predetermined position within the memory hole 25, for example, a position which is below the step 25c and in an upper portion of the conductive film 15.

Next, the impurity, for example, an arsenic (As) is ion injected to the semiconductor film 17d from the above by using the opening of the memory hole 25 in the insulating layer 16 as a mask. Accordingly, the impurity is doped to the portion above the step 25c in the semiconductor film 17d. Thereafter, the photo resist 26 within the memory hole 25 is removed.

Next, as shown in FIG. 8C, the photo resist 26 is applied onto the insulating layer 16 in such a manner as to again embed the inner portion of the memory hole 25. Further, the etching back is carried out with respect to the photo resist 26, and the upper surface of the photo resist 26 is set to a predetermined position within the memory hole 25, for example, a position which is above the step 25c and in the lower portion of the insulating layer 16. Further, the impurity, for example, the arsenic (As) is ion injected to the semiconductor film 17d from a direction which is inclined, for example, at 5 degree from a center axis of the memory hole 25. Accordingly, the impurity is doped to the semiconductor film 17d above the upper surface of the photo resist 26. Thereafter, the photo resist 26 within the memory hole 25 is removed.

Next, as shown in FIG. 8D, the photo resist 26 is applied onto the insulating layer 16 in such a manner as to again embed the inner portion of the memory hole 25. Further, the etching back is carried out with respect to the photo resist 26, and the upper surface of the photo resist 26 is set to a predetermined position within the memory hole 25, for example, a position which is below the upper surface of the insulating layer 16 and in the upper portion of the insulating layer 16.

Further, there is removed the portion which is not covered by the photo resist 26 in the semiconductor film 17d, that is, the portion on the upper surface of the insulating layer 16 in the semiconductor film 17d and the upper portion on the side surface of the memory hole 25 in the semiconductor film 17d. At this time, the portion on the upper surface of the insulating layer 16 in the insulating film 21 is also removed. In the case that the semiconductor film 17d is the polysilicon film to which the impurity is doped, there is a case that it is deposited and expanded by an application of the heat. In this case, the upper portion of the memory hole 25 is occluded by the volume expanded semiconductor film 17d. However, since the upper portion on the side surface of the memory hole 25 in the semiconductor film 17d is removed, the memory hole 25 is not occluded, and the embedding of the material into the inner portion of the memory hole 25 is not obstructed. Accordingly, the tubular semiconductor pillar 17 is formed in the inner portion of the memory hole 25. Thereafter, the inner portion of the memory hole 25, that is, the photo resist 26 within the tube of the semiconductor pillar 17 is removed.

Next, the occlusion film 18, for example, the silicon oxide film is formed on the insulating layer 16 in accordance with a method under a condition that a coverage is inferior, for example, a plasma chemical vapor deposition (CVD) method, as shown in FIG. 8E. Since the upper surface of the conductive layer 15 is exposed into the inner portion of the memory hole 25b at a width of 5 nm, and the step 25c is formed, the occlusion film 18 occludes the memory hole 25 on the step 25c. The silicon oxide film is not formed in the side surface of the portion of the stacked body 11 in the memory hole 25. However, the silicon oxide film may be formed on the side surface of the conductive layer 15 in the memory hole 25 at a time of forming the occlusion film 18. The conductive layer 15 is used as the selector gate SG in the semiconductor device 1. Accordingly, the selector gate SG does not repeat the writing and the deleting. Therefore, even if the silicon oxide film is formed on the side surface of the conductive layer 15, a fluctuation of a threshold value is less affected.

Further, even if the silicon oxide film is formed in the side surface of the portion of the stacked body 11 in the memory hole 25, it can be easily detrapped in accordance with a direct tunneling as long as it has the film thickness within 3 nm, and no problem is generated.

Next, as shown in FIG. 8F, a semiconductor film 19c, for example, a nondoped silicon (nondoped-Si) is formed on the insulating layer 16 in accordance with the CVD method in such a manner as to embed the above of the portion which is closed by the occlusion film 18 in the inner portion of the memory hole 25b.

Next, as shown in FIG. 9A, the etching back is carried out with respect to the semiconductor film 19c, and the upper portion of the semiconductor pillar 17 is exposed. Since the etching back is carried out with respect to the oxide film by a selection ratio, there is a case that the occlusion film 18 covering the semiconductor pillar 17 which is formed on the side surface of the memory hole 25b is left. In this case, the occlusion film 18 is removed in accordance with an isotropic etching, for example, by the hydrofluoric acid.

Next, as shown in FIG. 9B, the silicon film 19b to which the impurity, for example, a phosphor is doped is formed on the insulating layer 16 in such a manner as to embed the inner portion of the memory hole 25b. Thereafter, the etching back is carried out with respect to the conductive film 19b, and the upper surface of the conductive film 19b is positioned at the upper surface of the insulating layer 16. The conductive film 19b is used as a connection plug which is electrically connected to the semiconductor pillar 17.

Next, a wiring 23, for example, a metal wiring is formed on the conductive film 19b. The wiring 23 is used as the source line SL or the bit line BL. As mentioned above, as shown in FIG. 2, the semiconductor device 1 is manufactured.

Next, a description will be given of an effect of the embodiment.

In the embodiment, an inner diameter of the memory hole 25b is made larger, and the step 25c is formed. Accordingly, the occlusion film 18 can be formed in the step 25c. Therefore, the memory hole 25a can be formed as an air gap.

Further, since the occlusion film 18 is formed in accordance with the plasma CVD method, the etching back is not necessary, and it is possible to shorten the manufacturing process. Further, it is easy to control the deposited thickness.

It is possible to introduce the impurity into the semiconductor pillar 17 in a self aligning manner while using the opening of the memory hole 25 as the mask, by forming the step 25c.

In this case, the method of forming the occlusion film 18 is not limited to the plasma CVD method. As long as a deposing method so as to deposite in a vertical direction, a reaction is generated in the vicinity of an opening of the memory hole 25 by lowering a flow rate of the gas, raising a temperature or lowering a pressure, for example, in accordance with the LPCVD method. Further, the material of the occlusion film 18 is not limited to the silicon oxide film. For example, since the polysilicon is inferior in the coverage, it can be used as the occlusion film 18.

Further, in the embodiment, as shown in FIG. 8C, the ion is injected to the portion which covers the upper portion of the side surface of the memory hole 25b in the semiconductor film 17d, after the upper surface of the photo resist 26 is positioned in the lower portion of the insulating layer 16 above the step 25c within the memory hole 25, however, it is not limited to this. For example, as shown in FIG. 8E, the ion may be injected to the portion which covers the upper portion of the side surface of the memory hole 25b in the semiconductor film 17d after forming the occlusion film 18. Accordingly, it is possible to shorten the manufacturing process.

Comparative Example of Fourth Embodiment

Next, a description will be given of a manufacturing method of a semiconductor device according to a comparative example of the fourth embodiment.

FIGS. 10A and 10B are process cross sectional views illustrating the method for manufacturing the semiconductor device according to the comparative example of the fourth embodiment.

First of all, in the same manner as the fourth embodiment mentioned above, the processes shown in FIGS. 8A to 8D are executed. A description of these processes will be omitted.

Next, as shown in FIG. 10A, in the case that the silicon oxide film is formed on the surface of the semiconductor pillar 17 which is formed on the side surface of the memory hole 25, the silicon oxide film is removed. Thereafter, an insulating film 27, for example, a silicon nitride film is formed on the insulating layer 16 in such a manner as to embed the memory hole 25. Further, the etching back is carried out with respect to the insulating film 27, and an upper surface of the insulating film 27 is positioned at a predetermined position of the memory hole 25b, for example, a lower portion of the memory hole 25b.

Next, as shown in FIG. 10B, the conductive film 19b is formed on the insulating layer 16 in such a manner as to embed the memory hole 25b. Thereafter, the etching back is carried out with respect to the conductive film 19b, and the upper surface of the conductive film 19b is positioned at the upper surface of the insulating layer 16.

Further, the wiring 23, for example, the metal wiring is formed on the conductive film 19b. Accordingly, as shown in FIG. 4, the semiconductor device 101 is manufactured.

According to the comparative example, in the case of comparing with the fourth embodiment mentioned above, the property is relatively inferior.

Fifth Embodiment

Next, a description will be given of a fifth embodiment.

Figures 11A, 11B, 11C:
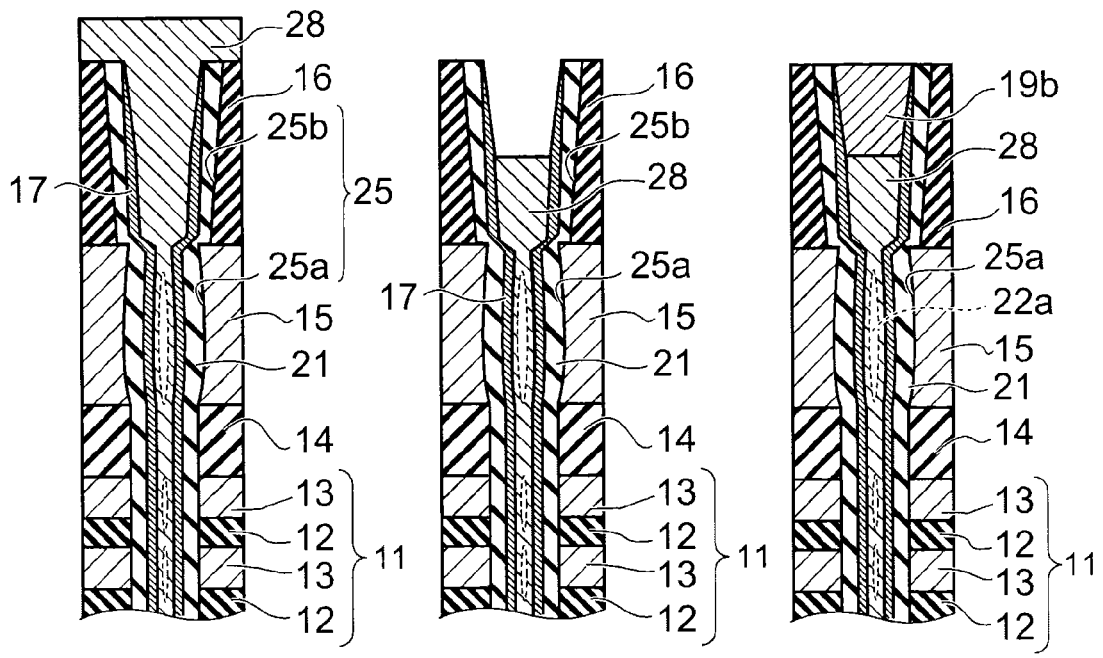
FIGS. 11A to 11C are process cross sectional views illustrating a method for manufacturing a semiconductor device according to a fifth embodiment.

FIGS. 11A to 11C are process cross sectional views illustrating a method for manufacturing a semiconductor device according to the fifth embodiment. The embodiment relates to the manufacturing method of the semiconductor device 2 according to the second embodiment.

First of all, in the same manner as the fourth embodiment mentioned above, the processes shown in FIGS. 8A to 8D are executed. A description of these processes will be omitted.

Next, as shown in FIG. 11A, in the case that the silicon oxide film is formed on the surface of the semiconductor pillar 17 which is formed on the side surface of the memory hole 25, the silicon oxide film is removed. Thereafter, a non-insulating member 28 is deposited on the insulating layer 16 in such a manner as to embed the memory hole 25.

Next, as shown in FIG. 11B, the etching back is carried out with respect to the deposited non-insulating member 28, and the upper surface of the non-insulating member 28 is positioned at a predetermined position of the memory hole 25b, for example, in a lower portion of the memory hole 25b.

Next, as shown in FIG. 11C, the conductive film 19b is formed on the insulating layer 16 in such a manner as to embed the memory hole 25b. Thereafter, the etching back is carried out with respect to the conductive film 19b, and the upper surface of the conductive film 19b is positioned on the upper surface of the insulating layer 16.

Further, the wiring 23, for example, the metal wiring is formed on the conductive film 19b. Accordingly, as shown in FIG. 5, the semiconductor device 2 is manufactured.

Next, a description will be given of an effect of the embodiment.

In the embodiment, it is possible to suppress the formation of the insulating film 27 which traps the electron, within the tube of the semiconductor pillar 17. Accordingly, it is possible to hold down the fluctuation of the threshold value in the semiconductor pillar 17. Accordingly, it is possible to improve an electric property of the semiconductor device 101. The other configurations and effects than the above in the embodiment are the same as the fourth embodiment mentioned above.

In this case, the insulating film, for example, the silicon oxide film may be formed at a thickness within 3 nm in accordance with an atomic layer deposition (ALD) method in such a manner as to cover the memory hole 25 via the semiconductor pillar 17. Thereafter, the semiconductor film 19a may be formed on the insulating film 16 in such a manner as to embed the memory hole 25.

Sixth Embodiment

Next, a description will be given of a sixth embodiment.

Figures 12A, 12B, 12C:
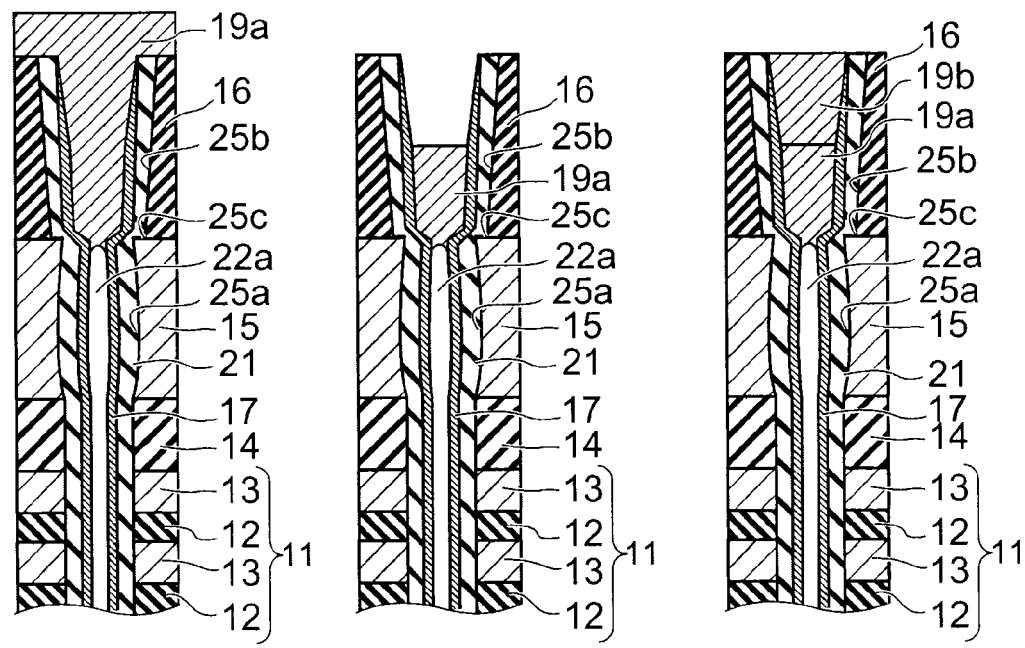
FIGS. 12A to 12C are process cross sectional views illustrating a method for manufacturing a semiconductor device according to a sixth embodiment.

FIGS. 12A to 12C are process cross sectional views illustrating a method for manufacturing a semiconductor device according to the sixth embodiment. The embodiment relates to the manufacturing method of the semiconductor device according to the third embodiment.

First of all, in the same manner as the fourth embodiment mentioned above, the processes shown in FIGS. 8A to 8D are executed. A description of these processes will be omitted.

Next, as shown in FIG. 12A, in the case that the silicon oxide film is formed on the surface of the semiconductor pillar 17 which is formed on the side surface of the memory hole 25, the silicon oxide film is removed. Thereafter, the semiconductor film 19a, for example, the polysilicon is formed on the insulating layer 16 in accordance with the method under the condition that the coverage is interior, for example, the plasma chemical vapor deposition (CVD) method. Since the upper surface of the conductive layer 15 is exposed into the inner portion of the memory hole 25b at a width of 5 nm, and the step 25c is formed, the semiconductor film 19a occludes the memory hole 25 on the step 25c.

Next, as shown in FIG. 12B, the etching back is carried out with respect to the semiconductor film 19a, and the upper surface of the semiconductor film 19a is positioned at a predetermined position within the memory hole 25, for example, in a lower portion of insulating layer 16 above the step 25c. Accordingly, the upper portion of the semiconductor pillar 17 is exposed.

Next, as shown in FIG. 12C, the conductive film 19b, for example, the silicon film to which the phosphor is doped is formed on the insulating layer 16 in such a manner as to embed the memory hole 25b. Thereafter, the etching back is carried out with respect to the conductive film 19b. The conductive film 19b is used as a connection plug which is electrically connected to the semiconductor pillar 17.

Next, the wiring 23, for example, the metal wiring is formed on the conductive film 19b. The wiring 23 is used as the source line SL or the bit line BL. Accordingly, as shown in FIG. 7, the semiconductor device 3 is manufactured. According to the embodiment, the semiconductor film 19a serves as the diffusion layer which is formed above the selector gate SG, together with the portion 17b. Accordingly, since a cross sectional area of the diffusion layer becomes larger, it is possible to lower a diffusion layer resistance and a contact resistance. Further, the semiconductor film 19a is not formed in the inner portion of the selector gate SG. Therefore, a profile of the diffusion layer is not affected by the heat process, and it is possible to retain a steep diffusion layer profile. Accordingly, since an electric property of the semiconductor device 3 is not deteriorated, it is easy to carry out a deletion to the cell. The other configurations and effects than the above in the embodiment are the same as the fourth embodiment mentioned above.

According to the embodiment mentioned above, it is possible to provide the semiconductor device and the manufacturing method of the same which can improve the electric property.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
    a stacked body comprising one or more first conductive layer(s) and one or more first insulating layer(s), which are alternately stacked;
    a tubular semiconductor pillar, which comprises a polysilicon to which an impurity is doped, that passes through the layers of the stacked body, wherein the inside of the tubular semiconductor pillar contains a non-insulating member having an effective impurity concentration; and
    a charge storage layer provided between the first conductive layer(s) and the tubular semiconductor pillar;
    wherein a first effective impurity concentration of the non-insulating member is lower than a second effective impurity concentration of the tubular semiconductor pillar.

2. The device according to claim 1, wherein the non-insulating member comprises silicon.

3. The device according to claim 1, further comprising a conductive layer embedded within the tubular semiconductor pillar above the non-insulating member.

4. The device according to claim 1, further comprising a a first insulating film which is provided between the semiconductor pillar and the non-insulating member.

5. The device according to claim 4, wherein a film thickness of the first insulating film is not more than 2.5 nm.

6. The device according to claim 1, wherein an air gap is provided inside the non-insulating member.

7. The device according to claim 1, further comprising:
a second conductive layer provided on the stacked body that can serve as a selector gate;
a second insulating layer provided on the second conductive layer; and
a second insulating film;
wherein the semiconductor pillar passes through the second conductive layer and the second insulating layer, and the second insulating film is provided between the semiconductor pillar and the second conductive layer.

8. The device according to claim 7, wherein an air gap is provided inside the non-insulating member, and the air gap is located at a height of the second conductive layer.

9. The device according to claim 7, wherein a step is located between the second conductive layer and the second insulating layer.

10. The device according to claim 4, wherein the first insulating film comprises a silicon oxide.

\* \* \* \* \*